US007209613B2

(12) United States Patent
Liang et al.

(10) Patent No.: US 7,209,613 B2
(45) Date of Patent: Apr. 24, 2007

(54) ELECTROMAGNETIC FIELD SENSING APPARATUS

(75) Inventors: Wen-Lie Liang, Hsinchu (TW); Wen-Tron Shay, Hsinchu (TW); Wen-Jen Tseng, Kaohsiung (TW); Jen-Ming Ferng, Taoyuan (TW); Mao-Sheng Huang, Taichung (TW)

(73) Assignee: Industrial Technology Research Institute, Hsin Chu Hsien (TW)

( * ) Notice: Subject to any disclaimer, the term of this patent is extended or adjusted under 35 U.S.C. 154(b) by 0 days.

(21) Appl. No.: 11/472,896

(22) Filed: Jun. 22, 2006

(65) Prior Publication Data
US 2006/0245679 A1   Nov. 2, 2006

Related U.S. Application Data

(62) Division of application No. 10/739,728, filed on Dec. 17, 2003, now Pat. No. 7,088,879.

(30) Foreign Application Priority Data
Dec. 31, 2002   (TW) .............................. 91138192 A

(51) Int. Cl.
*G02B 6/44* (2006.01)
(52) U.S. Cl. .............................. 385/100; 385/1; 385/12
(58) Field of Classification Search ............... 385/12, 385/1, 100
See application file for complete search history.

(56) References Cited

U.S. PATENT DOCUMENTS

| 4,002,975 | A |   | 1/1977 | Erickson et al. |
| 4,277,744 | A |   | 7/1981 | Audone et al. |
| 4,929,050 | A | * | 5/1990 | Wilson .................. 250/227.17 |
| 5,210,407 | A |   | 5/1993 | Ito et al. |
| 5,267,336 | A |   | 11/1993 | Sriram et al. |
| 5,488,677 | A |   | 1/1996 | Tokano |
| 5,574,805 | A |   | 11/1996 | Toba et al. |

(Continued)

FOREIGN PATENT DOCUMENTS

EP       0 664 460       7/1995

(Continued)

OTHER PUBLICATIONS

Kuwabara et al., *Development and Analysis of Electric Field Sensor Using LiNbO₃ Optical Modulator*, IEEE Transactions on Electromagnetic Compatibility, vol. 34, No. 4 (1992), pp. 391-396.

*Primary Examiner*—Ellen E. Kim
(74) *Attorney, Agent, or Firm*—Seyfarth Shaw LLP

(57)    ABSTRACT

An electromagnetic field sensing apparatus includes an optical modulator, a miniature antenna for sensing the electromagnetic field, a light source, a first optical fiber, an optical detector and a second fiber. The optical modulator can vary the amplitude of a light beam propagating therethrough in response to an electric field intensity. The miniature antenna for sensing the electromagnetic field can sense both the electric field intensity and the magnetic field intensity of an electromagnetic field and apply an electric voltage to the optical modulator in response to the sensed electromagnetic field intensity. The light source is used to generate a light beam, the first optical fiber is used for transmitting the light beam to the modulator, and the second fiber is used for transmitting the light beam from the modulator to the optical detector.

6 Claims, 4 Drawing Sheets

U.S. PATENT DOCUMENTS 5,583,637 A * 12/1996 Tokano et al. ............... 356/477
5,625,284 A    4/1997 Tokano
5,670,870 A    9/1997 Muramatsu
5,781,003 A    7/1998 Kondo
5,815,610 A    9/1998 Tokano et al.

6,211,982 B1 * 4/2001 Goldner et al. ............. 398/168

FOREIGN PATENT DOCUMENTS

EP    0 668 506    8/1995
EP    0 668 507    8/1995

* cited by examiner

ELECTROMAGNETIC FIELD SENSING APPARATUS

REFERENCE TO RELATED APPLICATION

This is a division of U.S. patent application Ser. No. 10/739,728, filed Dec. 17, 2003.

BACKGROUND OF THE INVENTION

1. Field of the Invention

The present invention relates to a miniature antenna and an electromagnetic field sensing apparatus, and more particularly, to a miniature antenna and an electromagnetic field sensing apparatus for sensing an electric field signal and a magnetic field signal of an electromagnetic field.

2. Description of the Related Art

Conventional sensors for sensing an electromagnetic field (antenna for instance) use a cable to transmit signals. However, the electromagnetic field will be interfered by the cable since the cable itself is conductor, and the so-called optical sensor for sensing the electromagnetic field is developed to solve this problem.

The optical sensor for sensing the electromagnetic field usually uses the Nd:YAG laser as the light source, and uses the $LiNbO_3$ crystal as the substrate on which optical waveguides are made for forming interfering signals (See "IEEE Transactions on electromagnetic compatibility, vol. 34, No. 4, 1992, pp. 391–396"). In addition, the Japanese corporation Tokin has published more than 10 related patents, which primarily relate to technology for designing and manufacturing the optical modulator of the electric field sensing device, and technology about the thermal compensation with the optical fibers (See "EP0664460B1, EP0668506A1 and EP0668507A1"). However, these papers and patents only focus on the electric field sensing device, and the magnetic field sensing device is not discussed at all.

FIG. 1 is a schematic diagram of an optical apparatus 10 for sensing an electric field according to the prior art. As shown in FIG. 1, the optical apparatus 10 for sensing the electric field uses an electric field antenna 12 to sense the electric field signals of the electromagnetic field to be sensed. The output port of the electric field antenna 12 is connected to an optical modulator 14, which comprises one optical input waveguide 16, two optical phase modulation waveguides 18 and one optical output waveguide 20. The optical modulator 14 uses the $LiNbO_3$ crystal, and there are two electrodes 24 and 26 positioned above the optical phase modulation waveguide 18.

The semiconductor laser emitted from the light source is conducted into the optical input waveguide 16 via the first optical fiber 22, enters the optical phase modulation waveguide 18 after light splitting, and is then ultimately merged to the optical output waveguide 20. The voltage difference between the electrode 24 and electrode 26 shall change the refractive index of the optical phase modulation waveguide 18, and the phase of the laser propagating through the two optical phase modulation waveguide 18 is changed, i.e., the phase difference is changed. As a result, the output amplitude of the laser from the optical output waveguide 20 changes with the voltage difference between the electrode 24 and the electrode 26. When the electric field antenna 12 receives electric field signals, its output electric field signals shall modulate the amplitude of the output laser from the optical output waveguide 20. Therefore, electric field signals are converted into light signals on the optical modulator 14, and the optical signal is then transmitted to the optical detector 30 via the second optical fiber 28. Subsequently, the interference problem is solved since there is no cable.

However, a magnetic field sensing device is needed to sense the magnetic field since the electric field signals measured at the near field fail to represent the whole electromagnetic field. In addition, the optical sensor for sensing the electromagnetic field generates the zero drift as the environmental temperature varies. Although the zero drift can be overcome by connecting a temperature sensing device with a conductive wire and controlling the electric field sensing device according to the temperature variation feedback from the temperature sensing device, the conductive wire shall also influence the electromagnetic field to be sensed. Therefore, it is necessary to develop a compensation technology free of conductors.

SUMMARY OF THE INVENTION

The objective of the present invention is to provide a miniature antenna and an electromagnetic field sensing apparatus for sensing an electric field signal and magnetic field signal of an electromagnetic field.

In order to achieve the above-mentioned objective, and avoid the problems of the prior art, the present invention provides a miniature antenna and an electromagnetic field sensing apparatus. The electromagnetic field sensing apparatus comprises an optical modulator for changing the amplitude of a light beam propagating therethrough in response to an electric field intensity, a miniature antenna for sensing the intensity of the electromagnetic field and applying an electric field to the optical modulator in response to the intensity of the electromagnetic field, a light source for generating the light beam, a first optical fiber for transmitting the light beam to the optical modulator, a second optical fiber connected to the optical modulator and an optical detector for transforming the light beam transmitted from the second optical fiber into an electrical signal.

The miniature antenna for sensing the intensity of the electromagnetic field comprises a first line, a first optical switch positioned at one end of the first line, a second optical switch positioned at the other end of the first line, a second line connected to the first optical switch and a third line connected to the second optical switch. The miniature antenna forms a loop antenna for sensing a magnetic field when the first optical switch and the second optical switch are turned on, and forms a line antenna for sensing an electric field when the first optical switch and the second optical switch are turned off.

Compared with the prior art, the electromagnetic field sensing apparatus of the present invention can sense both the magnetic field signal and the electric field signal of the electromagnetic field to be sensed using a single miniature antenna, which is controlled by the optical switches.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
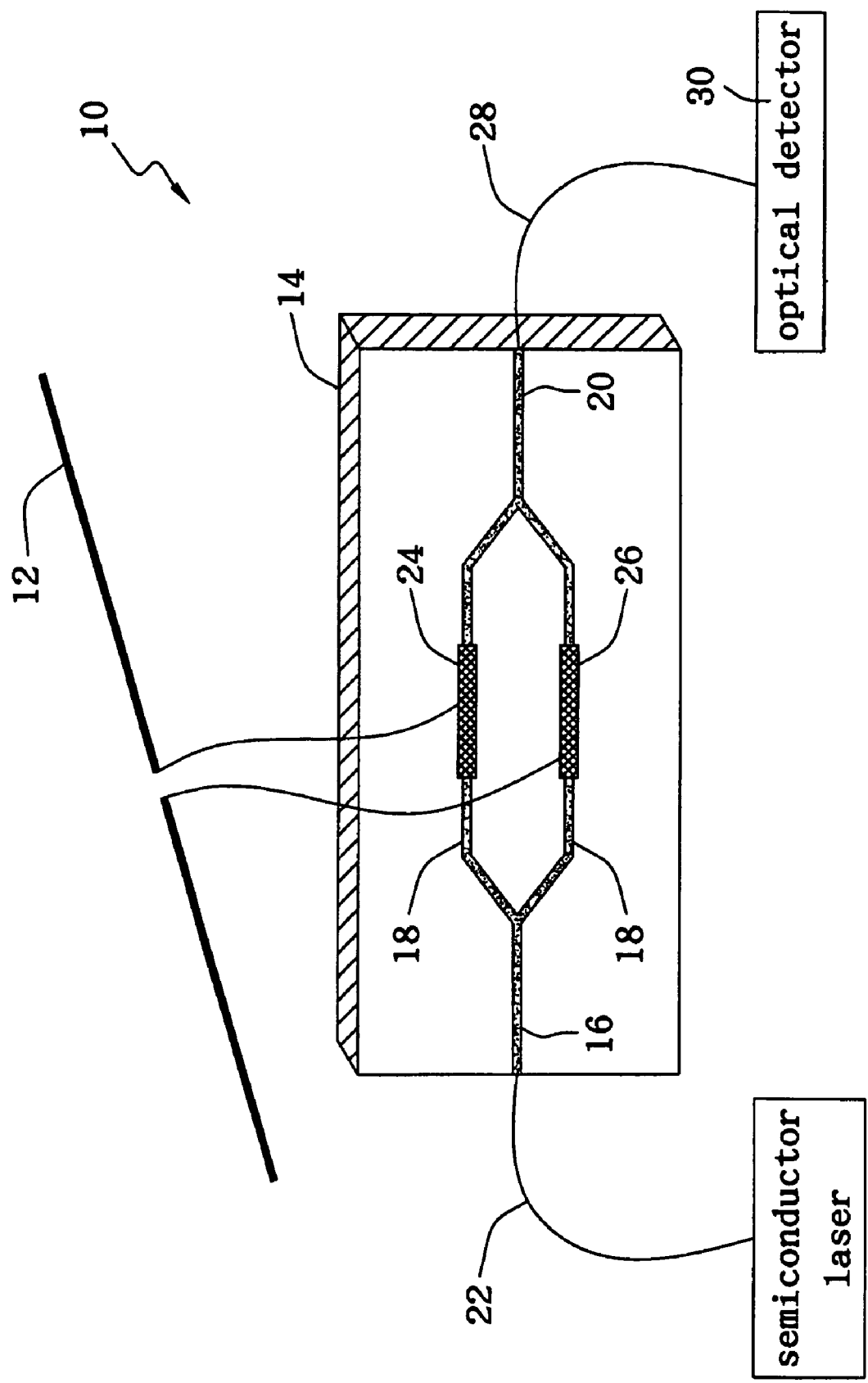
FIG. 1 is a schematic diagram of a prior art optical apparatus for sensing an electric field.
Figure 2:
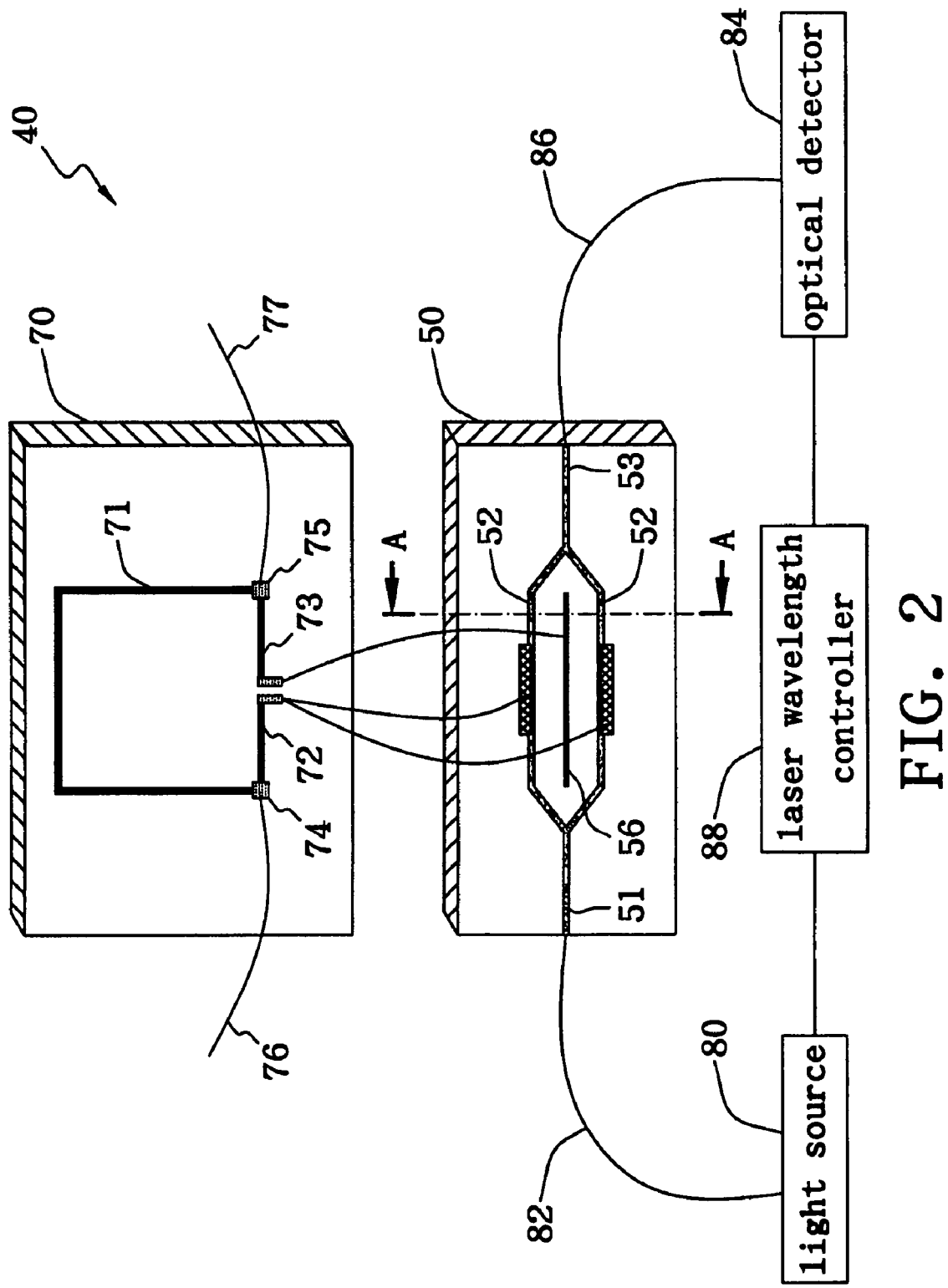
FIG. 2 is a schematic diagram of an electromagnetic field sensing apparatus according to the present invention.

FIG. 2 is a schematic diagram of an electromagnetic field sensing apparatus 40 according to the present invention. As shown in FIG. 2, the electromagnetic field sensing apparatus 40 comprises an optical modulator 50, a miniature antenna 70 for sensing the intensity of the electromagnetic field, a light source 80 of semiconductor laser, a first optical fiber 82, an optical detector 84 and a second optical fiber 86. The miniature antenna 70 senses the intensity of the electromagnetic field signals and applies an electric field on the optical modulator 50 in response to the sensed intensity of the electromagnetic field, while the optical modulator 50 changes the amplitude of the light beam propagating therethrough in response to the electric field applied by the miniature antenna 70. The light source 80 is used to generate a light beam such as a laser, and the first optical fiber 82 is used to transmit the light beam generated by the light source 80 to the optical modulator 50. The optical detector 84 is used to convert an optical input signal into an electric signal, and the second optical fiber 86 is used to transmit the light beam output from the optical modulator 50 to the optical detector 84. In addition, the optical modulator 50 comprises an optical input waveguide 51, two optical phase modulation waveguides 52 and an optical output waveguide 53.

The miniature antenna 70 comprises a first line 71, a first optical switch 74 positioned on one end of the first line 71, a second optical switch 75 positioned on the other end of the first line 71, a second line 72 connected to the first line 71 though the first optical switch 74, and a third line 73 connected to the first line 71 through the second optical switch 75. When the first optical switch 74 and the second optical switch 75 are turned on, the first line 71, the second line 72 and the third line 73 form a loop antenna for sensing magnetic field signals, while when the first optical switch 74 and the second optical switch 75 are turned off, the second line 72 and the third line 73 form a line antenna for sensing electric field signals. The optical fibers 76 and 77 are used to transmit switching signals to control the on/off of the first optical switch 74 and the second optical switch 75.

Figure 3:
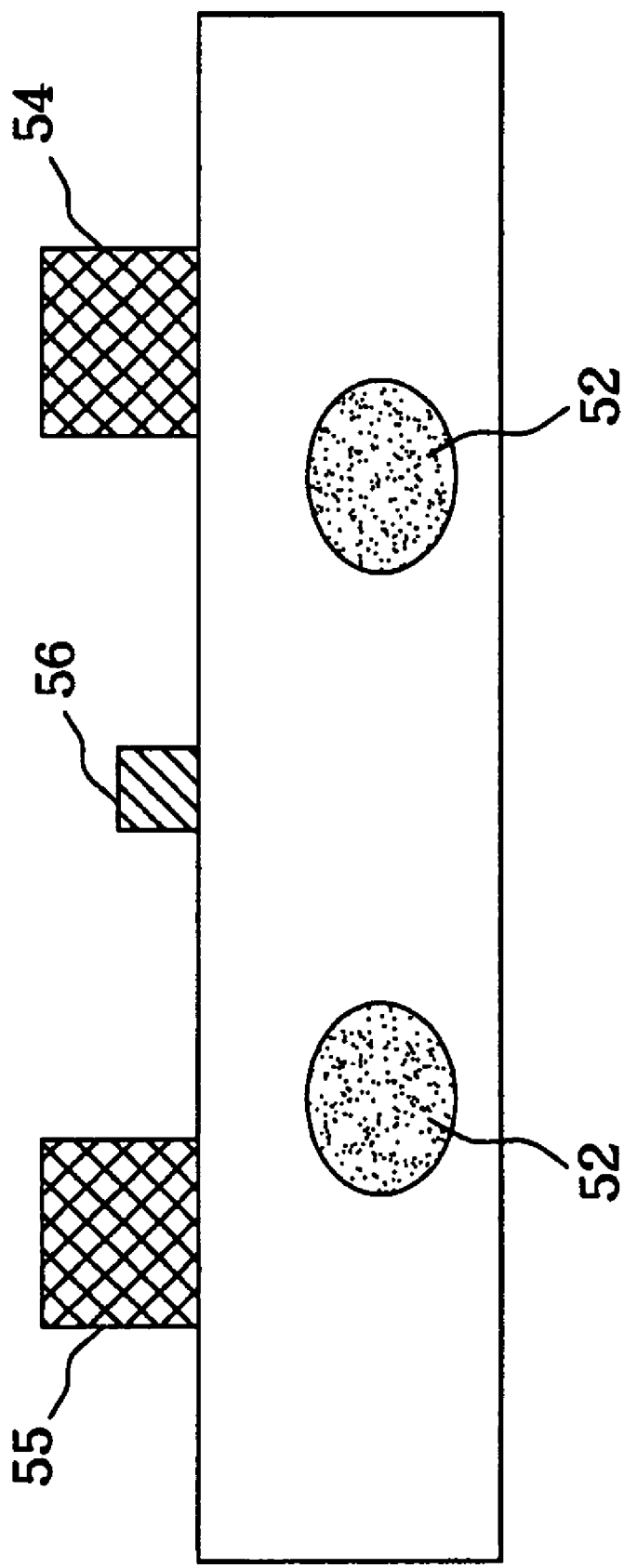
FIG. 3 is a cross-sectional diagram of the optical modulator along A—A line according to the present invention.

FIG. 3 is a cross-sectional diagram of the optical modulator 50 along A—A line according to the present invention. As shown in FIG. 3, the electrodes 54 and 55 are positioned above the optical phase modulation waveguide 52, and there is an electrode 56 between electrodes 54 and 55. The electrodes 54 and 55 are electrically connected to one output port of the miniature antenna 70, while the electrode 56 is electrically connected to another output port. When the miniature antenna 70 senses the intensity of the electromagnetic field to be sensed, it converts the intensity signal into an electric field signal, and applies an electric field (voltage difference) to the electrodes 54, 55 and 56 in response to the electric field signal.

The light beam emitted from the light source 80 is conducted into the optical input waveguide 51 via the first optical fiber 82, enters the optical phase modulation waveguide 52 after light splitting, and then is ultimately merged to the optical output waveguide 53. The voltage difference between the electrodes 54, 55 and electrode 56 shall change the refractive index of the optical phase modulation waveguide 52, and thus change the phase difference of the light beams propagating through the two optical phase modulation waveguides 52. Therefore, the amplitude of the output light from the optical output waveguide 53 changes with the voltage difference between the electrodes 54, 55 and 56.

The above structure details of the optical modulator 50 are based on X-cut $LiNbO_3$ optical modulator. If the structure of the optical modulator 50 changes, for example, it changes into Z-cut $LiNbO_3$ optical modulator, these details will be changed accordingly.

Figure 4:
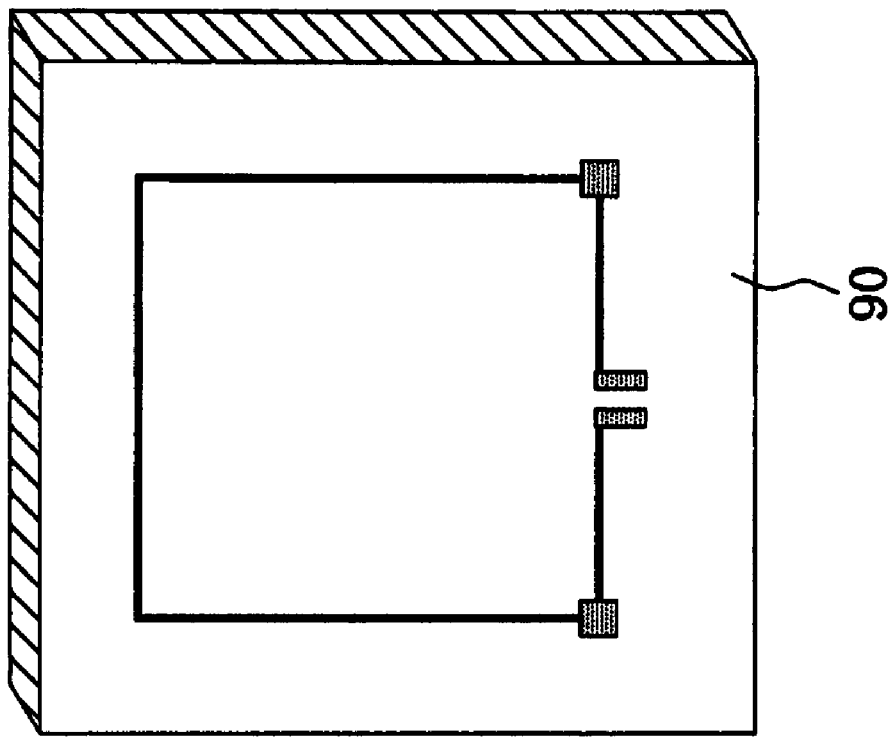
FIG. 4 is a schematic diagram of a miniature antenna for sensing an electromagnetic field according to the present invention.
Figure 4:
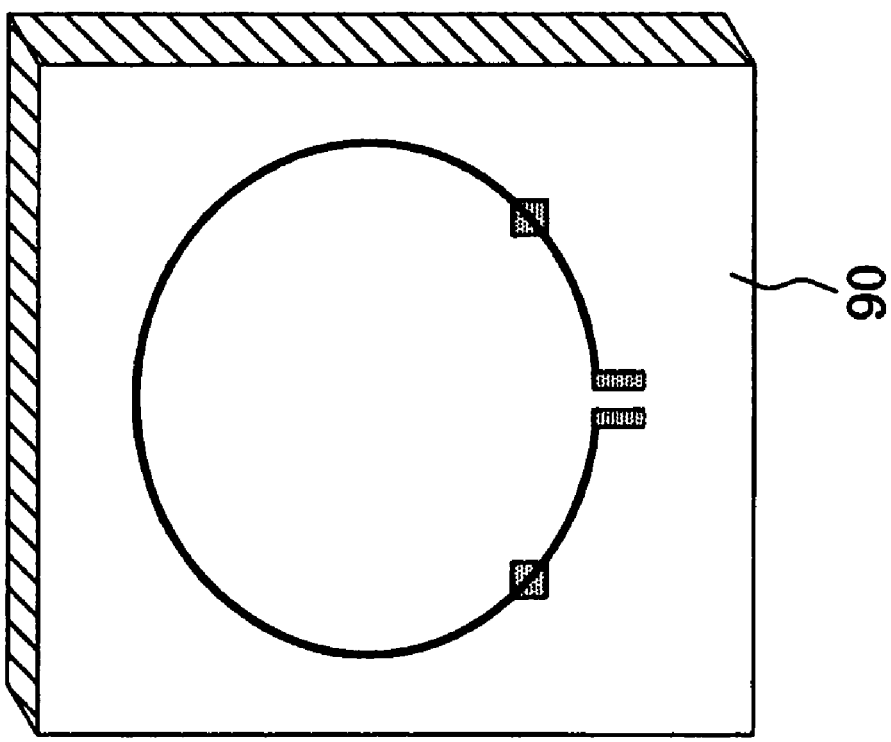

FIG. 4 is a schematic diagram of the miniature antenna 70 according to the present invention. As shown in FIG. 4, the miniature antenna 70 is formed on a substrate 90, such as a substrate made of mica, and it can be a circular loop or a rectangular loop. In addition, three groups of miniature antenna 70 can be positioned on three orthogonal surfaces for 3-dimensionally polarized electromagnetic field measurement.

After the miniature antenna 70 has sensed the electromagnetic field, the electromagnetic field signal is loaded onto the light beam through the optical modulator. Temperature shift will generate a drifting of the phase difference between the two optical phase modulation waveguides 52, and results in variation of the modulation sensitivity and linearity of the electromagnetic field signal. Subsequently, the intensity of the signal is changed and error occurs. When the temperature variation results in phase difference of the light beam, which further shifts the level of the interfering signal, the present invention can measure the average level of the output optical signals, acquire the DC component of the electric signals converted by the optical detector 84, and feedback to the light source 80 by the laser wavelength controller 88 to control the wavelength. As a result, the level of the interfering signal can be maintained in a predetermined level to eliminate the zero drift.

Compared with the prior art, the electromagnetic field sensing apparatus 40 of the present invention can sense both the magnetic field signal and the electric field signal of the electromagnetic field to be sensed using a single miniature antenna 70, which is controlled by the optical switches 74, 75.

The above-described embodiments of the present invention are intended to be illustrative only. Numerous alternative embodiments may be devised by those skilled in the art without departing from the scope of the following claims.

What is claimed is:

1. An electromagnetic field sensing apparatus, comprising:
   a light source for generating a light beam;
   an optical modulator for changing a phase of the light beam propagating therethrough in response to an electric field;
   a miniature antenna for transforming a sensed electromagnetic field into an electric field and then applying to the optical modulator, the miniature antenna including:
   a first line;
   a first optical switch positioned at one end of the first line;

a second optical switch positioned at the other end of the first line;

a second line connected to the first optical switch; and a third line connected to the second optical switch;

wherein the first optical switch and the second optical switch are turned on for sensing a magnetic field and turned off for sensing an electric field;

a first optical fiber for transmitting the light beam to the optical modulator;

a second optical fiber connected to the optical modulator; and an optical detector for transforming the light beam transmitted from the second optical fiber into an electrical signal.

2. The electromagnetic field sensing apparatus of claim 1, wherein the miniature antenna is formed on a mica substrate.

3. The electromagnetic field sensing apparatus of claim 1, wherein the second line and the third line are formed substantially in straight.

4. The electromagnetic field sensing apparatus of claim 1, wherein the first line, the second line arid the third line are formed substantially as a loop.

5. The electromagnetic field sensing apparatus of claim 4, wherein the loop is rectangular or circular.

6. The electromagnetic field sensing apparatus of claim 1, wherein the optical modulator feedbacks an average level of the electrical signal to the light source for controlling the wavelength of the light beam.

* * * * *

UNITED STATES PATENT AND TRADEMARK OFFICE
CERTIFICATE OF CORRECTION

| | | |
|---|---|---|
| PATENT NO. | : 7,209,613 B2 | Page 1 of 1 |
| APPLICATION NO. | : 11/472896 | |
| DATED | : April 24, 2007 | |
| INVENTOR(S) | : Wen-Lie Liang et al. | |

It is certified that error appears in the above-identified patent and that said Letters Patent is hereby corrected as shown below:

Column 6,

Claim 4; line 6, "arid" should be --and--

Signed and Sealed this

Twenty-sixth Day of June, 2007

JON W. DUDAS
*Director of the United States Patent and Trademark Office*